United States Patent [19]
Utsumi

[11] Patent Number: 5,831,272
[45] Date of Patent: Nov. 3, 1998

[54] LOW ENERGY ELECTRON BEAM LITHOGRAPHY

[76] Inventor: Takao Utsumi, 225 Ridge Rd., Watchung, Somerset County, N.J. 07060

[21] Appl. No.: 955,833

[22] Filed: Oct. 21, 1997

[51] Int. Cl.⁶ ..................................................... H01J 37/30
[52] U.S. Cl. ........................................ 250/492.2; 250/398
[58] Field of Search ................................ 250/492.2, 398, 250/310

[56] References Cited

U.S. PATENT DOCUMENTS

| | | | |
|---|---|---|---|
| 4,427,886 | 1/1984 | Martin et al. ............................ | 250/310 |
| 5,130,547 | 7/1992 | Sakamoto et al. ....................... | 250/398 |
| 5,362,606 | 11/1994 | Hartney et al. .......................... | 430/315 |

OTHER PUBLICATIONS

Article entitled "High Throughput Submicron Lithography With Electron Beam Proximity Printing", by H. Bohlen et al., Solid State Technology, Sep., 1984, pp. 210–217.

An article entitled "Low voltage alternative for electron beam lithography", by Y.H. Lee, J Vac. Sci Tech B 10 (6), Nov./Dec. 1992, pp. 3094–3098.

An article entitled "E–Beam Lithography at low Voltages", by Y.H. Lee et al., SPIE vol. 1671 (1992), pp. 155–165.

An article entitled "Low voltage, high resolutiion studies of electron beam resist exposture and proximity effect", by M.A. McCord et al., J. Vac. Sci. Technical. B 10(6),Nov./Dec. 1992, pp. 3083–3087.

An article entitled "low–voltage electron beam lithography", by P.A. Peterson et al., J Vac. Sci Tech B 10(6), Nov./Dec. 1993, pp. 3088–3093.

An article entitled "Microcolumn Based Low Energy E–Beam Writing", by C. Stebler et al., Microelectronic Engineering 30 (1996), pp. 45–48.

An article entitled "Electron beam technology—SEM to microcolumn", by T.H.P. Chang et al., Microelectronic Engineering 32 (1996), pp. 113–130.

An article entitled "Arrayed miniture electron beam columns for high through sub–100 nm lithography", by T.H.P. Chang et al., J Vac. Sci Tech B 10 (6), Nov./Dec. 1992, pp. 2743–2748.

An article entitled "Micromachined electrostatic electron source", by D.A. Crewe et al., J Vac. Sci Tech B 10(6), Nov./Dec. 1992, pp. 2754–2758.

An article entitled "Electron–projection microfabrication system", by M B Hertage, J. Vac. Sci. Technical. vol. No. 6, Nov./Dec. 1975, pp. 1135–1140.

An article entitled "Projection electron–beam lithography: A new approach", by S.D. Berger et al., J. Vac. Sci. Technical. B 9(6), Nov./Dec. 1992, pp. 2996–2699.

An article entitled "Electron–Optics method for high–Throughput in a SCALPEL System: Preliminary Aanlysis", by W.K. Waskiewicz et al., MNE '97, Athens (Sep. 1997), pp. 1–4.

An article entitled "Projection ion beam lithography", by L. Loschner et al., J Vac. Sci Tech B 11(6), Nov./Dec. 1993, pp. 2409–2415.

*Primary Examiner*—Bruce Anderson
*Attorney, Agent, or Firm*—Irwin Ostroff; Arthur J. Torsiglieri

[57] ABSTRACT

A low energy electron beam lithography system uses an 2 KeV electron beam of about three microamperes, a mask formed from a monocrystalline silicon wafer with a membrane thinned to about 0.5 micron, and spaced from an electron-beam sensitive resist-coated substrate about 50 microns and with the thickness of the resist of about 0.1 micron.

18 Claims, 1 Drawing Sheet

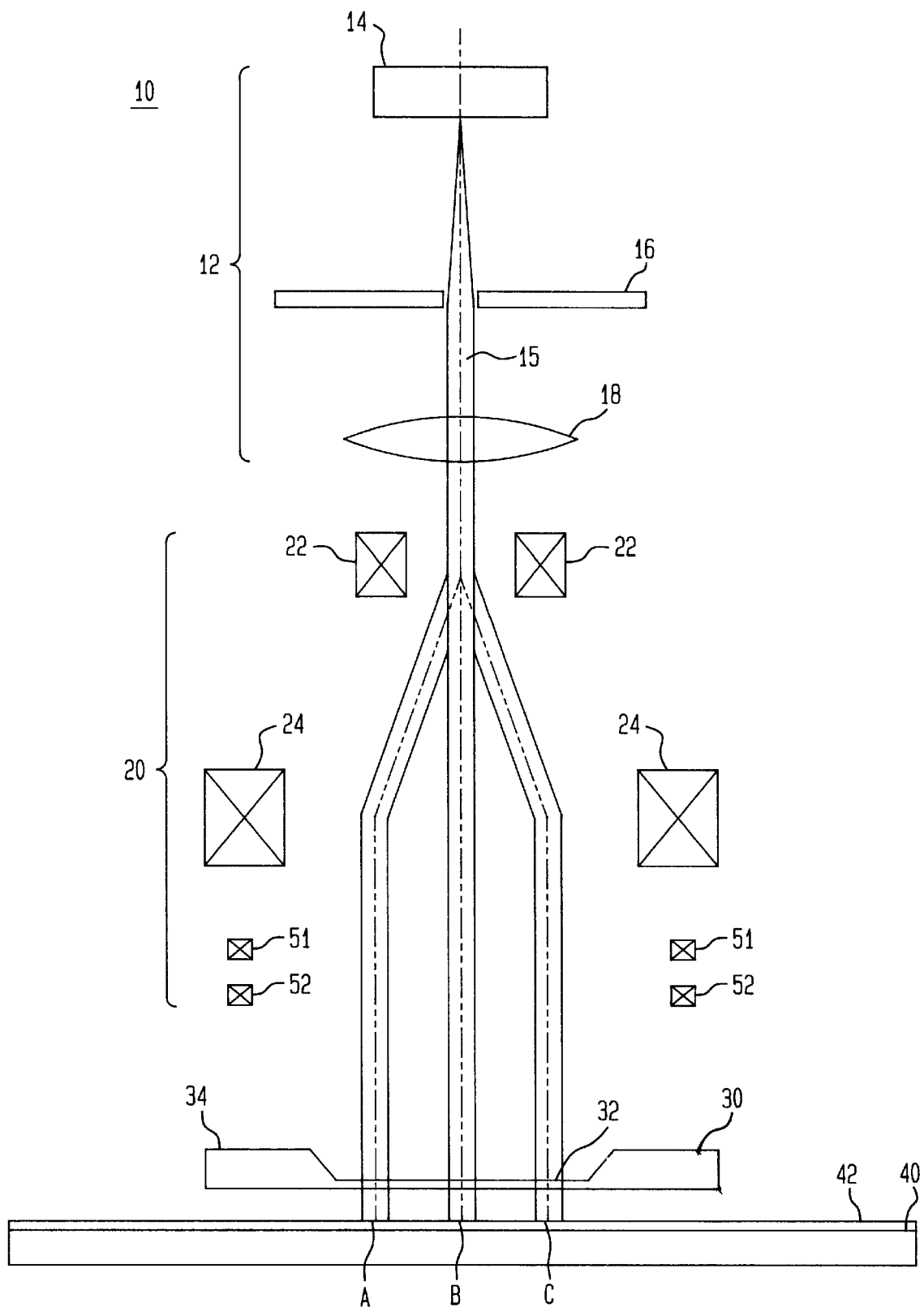

LOW ENERGY ELECTRON BEAM LITHOGRAPHY

FIELD OF THE INVENTION

This invention relates to the manufacture of integrated circuit devices, and more particularly, to apparatus and a method for use in such manufacture.

BACKGROUND OF THE INVENTION

A critical part of the manufacture of integrated circuit devices is the patterning of various layers on the surface of the semiconductor wafer, which after processing is diced up to provide the integrated circuit devices. These patterns define the various regions in the integrated circuit device, such as ion implantation regions, contact window regions, bonding pad regions, etc., and are generally formed by transferring patterns of geometric shapes in a mask to a thin layer of radiation resistive material, termed the "resist", that overlies the silicon wafer within which are to be formed the integrated circuit devices. Typically the pattern on the mask is on an enlarged scale and needs to be reduced for incidence on the resist.

Presently the pattern transfer process is generally performed by photolithography and the radiation used for the transfer is energy at optical wavelengths.

As the size of features in the pattern to be made in the resist has decreased, as the result of higher packing density of circuit elements in the integrated circuit, there has been a need to decrease correspondingly the wavelength of the optical radiation used for the transfer. It appears that the technology is rapidly approaching the limit at which optical radiation can serve usefully as the radiation needed to pattern the resist appropriately.

There are several alternatives that are currently being considered for use in the transfer of geometric patterns on a mask to the resist layer including the use of x-rays, extreme ultraviolet radiation, and electron beams.

Electron beams, which have the promise of precise control with fine detail, currently are being used primarily in the preparation of the masks used in optical lithography. While there is also some use of electron beams for direct writing of patterns on resists on silicon wafers, such use is limited to custom circuits that are made in small runs and sold at very high prices.

A recognized difficulty with the use of electron beams for use in patterning resists in the manufacture of integrated circuits is the low throughput of such use, that is compounded by the relatively high cost of electron beam exposure systems. Accordingly, the potential of electron beam exposure systems for use in the manufacture of integrated circuits is generally deemed not promising and the effort to develop commercial systems for such use has been limited.

In a paper entitled "High Throughput Submicron Lithography with Electron Beam Proximity Printing", published in September 1984, Solid State Technology, pps 210–217, there is described an electron beam lithography system in which the electron beam is operated with an energy of 10 KeV, which was deemed very low at that time, with a stencil mask that was 2 microns thick, a thickness that was then thinner than was conventional, and with a separation between the mask and wafer of 0.5 millimeters (500 microns) which was then deemed unusually close. The electron beam, which had a diameter of about 1 millimeter (1000 microns), only a small fraction of the area of the mask, was raster scanned across the mask by a first pair of deflection coils. A second pair of deflection coils was used to tilt the beam about a pivot point in the mask plane. A silicon wafer that included a central membrane that was thinned to 2 microns served as the mask. With such a mask and a beam energy of 10 KeV it was necessary to include an absorber layer of a suitable metal on the mask to intercept electrons that were not directed at openings in the mask. Otherwise such electrons would have passed through the thin silicon mask membrane and would have blurred the pattern to be formed on the resist. However, the use of a thicker silicon mask makes it more difficult to achieve narrow line widths because of the high aspect ratio of the line width versus the thickness of the mask.

However, this paper appeared to have little impact on workers in the field and effort on such proximity projection printing systems has languished since 1984. Instead the work on electron beam exposure systems generally has involved systems that employ high energy electrons in the beam to provide "stiffness" to the beam. A stiff beam is one whose diameter is well controlled and so better amenable to focusing and creating sharp images, and also less affected by stray fields. Stiffness is generally related to the energy or velocity of the electrons in the beam, the higher the energy the stiffer the beam.

For this reason, the commercial practice generally has been to use beams of at least 50 KeV in energy for very fine resolution, especially if currents large enough for fast writing. Apparatus employing such beams generally include: a source of such electrons, an illumination system that focuses and shapes such electrons into a beam and passes the beam through a mask and a projection system that projects such beams through a lens, all the while reducing the mask pattern, by a factor of five to twenty five, before it impinges on the resist.

However, it appears that, as the density of circuit elements in the integrated circuit are increased and the feature size of the pattern in the resist decreases, problems arise with the use of high energy beams. In particular, there is increased the proximity effect, which results in deformation of the pattern formed in the resist as the result of back scattering of electrons from the underlying silicon wafer substrate into the resist. This effect becomes more troublesome the finer the pattern sought to be formed in the resist. There is some evidence that if the accelerating voltages are made high enough, higher energy electrons forward scatter less in the resist and the back scattered electron scatter via a wider area, so that a relatively constant dose results in the resist. This makes the proximity effect correction easier, although it is impossible to eliminate the proximity effect completely. Additionally, it is characteristic of electron beam resists that their sensitivity tends to decrease the higher the energy of the electrons in the beam since the more energetic or faster electrons spend less time and deposit low energy in the resist. Accordingly, the more energetic the electrons, the larger the current (i.e., the higher the density of electrons in the beam) required for a given sensitivity. Moreover, the higher the density of electrons in the beam, the larger the space charge effects inside a column of a lens system, which tend to defocus the beam, which causes a blurring of the pattern and deterioration of the resolution of the pattern. Moreover, the larger the current, the higher the heating of the mask, the resist layer, and the substrate, the greater the distortion of the projected pattern. Therefore one has to limit the operating current in order to maintain the required accuracy. This, in turn, limits the throughput of the apparatus.

To meet some of these problems, fresh interest developed for a time in the use of low energy electron beams for patterning resists. In particular, a paper entitled "Low voltage alternative for electron beam lithography" J Vac. Sci Tech B 10 (6), November/December 1992, pps 3094–3098, describes experiments that demonstrate that proximity effects can be substantially reduced by using electrons of relatively low energy in the beam. In particular, it reports that the proximity effect was substantially reduced with electron beam energies of 2 KV used on a silicon substrate with a PMMA resist 66 nanometers thick. The work was intended primarily to show that low energy electron beams were potentially useful to expose resists sufficiently thick to be useful for patterning.

Although it has long been recognized that low energy electron beams are feasible for patterning resists and have some potential advantages, widespread commercial use on high volume devices has failed to result. Nevertheless, there have been substantial development efforts recently to utilize low voltage lithography by the use of 1. retarding field electron optical column, 2. multiple arrayed miniature electron beam columns, and 3. multiple arrayed scanning tunneling microscope tips.

SUMMARY OF THE INVENTION

The present invention is directed to a total system for low energy electron beam proximity projection lithography with a sufficient throughput and accuracy for patterning minimum feature size of submicron, or significantly below, for mass production.

The system of the present invention transfers a pattern on a mask formed by a thinned membrane, typically of a thickness of about 0.5 microns, in a wafer, typically of monocrystalline silicon, to an ultrathin electron-beam sensitive resist, typically about 0.1 micron thick, on a silicon substrate. The mask is a stencil mask in close proximity to the substrate, typically spaced apart no more than a few tens of microns, such as fifty microns. The electron beam is accelerated by a low voltage, typically about 2 KeV, and the beam current is relatively small, for example, about three microamperes. The electron beam is deflected perpendicular to the mask in a scanning pattern that may be either a raster or a vector scan or inter-laced scan.

The operating parameters of the electron beam and the dimensions and spacing of the mask relative to the substrate are such that the backscattering of electrons from the substrate into the resist is substantially eliminated. There is also typically avoided the need for a layer of a high atomic number metal over the mask to absorb electrons not aimed at openings in the mask.

A feature of a preferred embodiment of the invention is use of a silicon mask that, without the need for an absorber layer of another material, is sufficiently thick that it effectively blocks passage therethrough of electrons not aimed at the openings in the mask, while it is also sufficiently thin that its openings have a sufficiently low aspect ratio that few electrons directed at the openings in the mask will be intercepted by the sidewalls in passing through the openings.

A feature of the preferred embodiment of the invention is that the accelerating voltage and the thickness of the electron-beam sensitive resist are correlated such that essentially all of the electrons incident on the resist are absorbed directly by the electron-beam sensitive resist and few if any reach the substrate. This results both in highly efficient use of the electron beam to sensitize the resist and in essentially elimination of the proximity effect and the need to correct for it. In particular, the invention ideally results in exposing in the resist a volume that roughly has the shape of a sphere whose radius is essentially one-half the thickness of the resist.

From an apparatus aspect the present invention is directed to an electron beam lithography system for patterning a resist on a semiconductor substrate. The system comprises a source of an electron beam, a mask positioned in the path of the electron beam, and means for supporting a resist-covered substrate in the path of the electron beam and the mask. The system is characterized in that the electron-beam sensitive resist is ultrathin, the voltage accelerating the beam is sufficiently low that the proximity effect is insignificant, the power of the beam is sufficiently low that heating of mask, resist, and substrate is also insignificant, and the density of electrons in the beam is sufficiently low that space charge effects are insignificant.

From a method aspect, the present invention is directed to a process of patterning a resist-covered silicon substrate in the manufacture of silicon integrated circuits. The process comprises the steps of: positioning in an electron beam apparatus a silicon substrate having one surface on which there is a layer of an electron-beam sensitive resist to be patterned having a thickness in the range of about 0.03 to 0.3 micron; positioning a patterned mask adjacent the resist-layered surface of the silicon substrate spaced apart therefrom a distance of between about 10 to 300 microns; sweeping an electron beam over the patterned mask, substantially normal to the mask, at an accelerating voltage in the range of about 1 to 4 KeV and at a beam current up to about 20 microamperes, whereby there is patterned the resist with insignificant heating of the mask.

The invention will be better understood from the following more detailed description taken in conjunction with the accompanying drawing.

BRIEF DESCRIPTION OF THE DRAWING

The single FIGURE shows schematically a low energy beam lithography system illustrative of the invention.

DETAILED DESCRIPTION

With reference now to the drawing, there is shown a system (electron beam apparatus) 10 in accordance with the present invention. System includes an electron gun 12 including an electron source 14 that provides a beam of electrons 15, a beam limiting aperture 16, and a condensing lens 18 that forms the electrons into a parallel beam of essentially circular (or some appropriate) cross section, a scanning projection system 20 including first and second main sets 22, 24 of deflecting coils for deflecting the beam as an essentially parallel beam in either a raster or a vector scan mode over and essentially normal to a surface of a mask 30. The drawing shows the electron beam 15 in three separate positions A, B, and C. The system 10 further comprises first and second fine tuning sets of deflecting coils 51, 52. Deflecting coils 51, 52 are used to tilt the beam slightly at the pivot on the mask plane for the purpose of fine tuning of the alignment of mask and substrate to limit distortion of the system. The mask 30, which comprises a thin wafer of monocrystalline silicon, is provided with a thinned membrane 32 centrally located within a thicker outer edge portion 34. There is typically avoided the absorber layer which is major cause of mask distortion and appears important in the prior art discussed. Spaced about 50 microns below the silicon mask 30 is a workpiece comprising a relatively large silicon wafer 40 over which lies an ultrathin layer of electron-beam sensitive resist 42 that is to be patterned. The resist typically is about 0.1 $\mu$ thick and can be any of the resists amenable at ultrathin thicknesses to patterning by an electron beam.

Typically, the silicon wafer 40 is supported in a manner (not shown) that allows the wafer 40 to be stepped in the usual fashion so that successive areas of the resist-covered wafer 40 can be exposed in turn to the electron beam for a time appropriate for patterning the resist.

The system 10 also includes appropriate housing (not shown), typically a vacuum envelope, for enclosing the system. There 1S would also be included, though not shown in the drawing, the various parts used to establish the accelerating and deflecting voltages that are necessary for operation in the manner described.

With use of a relatively low accelerating voltage, for example about 2 KeV, the electrons are absorbed essentially completely in the resist layer 42, and accordingly, there are few electrons backscattered by the substrate 40 to create the proximity effect that would distort the pattern created by the incident beam. Moreover, because all electrons are used for sensitizingl the resist, the current is reduced. Because of the smaller current needed because of the higher sensitivity of the resist, there normally is avoided the significant heating of the mask by incident electrons not passing through the mask. Moreover, because of a short penetration range of the low energy electron beam, the mask does not need to have an additional absorbing layer. Also because heating effects should be small, the mask should be relatively free of distortion, and thereby there may usually be obviated the need for complex auxiliary methods for compensating for distortions of the mask. Moreover, because the mask can be relatively simple in structure, it becomes feasible to put the entire mask set on a single silicon wafer, which makes any level to level overlay of masks that may be needed easier to do.

In electron beam exposure systems, it is important to include alignment and registration marks both on the mask and on the silicon substrate. and to align the markers on the mask to such marks on the substrate. The correct alignment is provided by detecting electrons which pass through the marks on the mask to marks on the substrate and these are collected at the back of the substrate. This current which goes into the substrate generally is sufficiently small that it does not cause any significant proximity effect.

Finally, since this system is essentially a low power system, there should be little vaporization of the resist or other materials to adversely affect the desired operation and to cause maintenance problems.

In particular, the specific values described are merely illustrative of a presently preferred mode of operation and a range of such values can be used without causing any of the specific undesired effects discussed becoming significant. For example, the electron-beam sensitive resist thickness may be in the range between 0.03 and 0.3 micron thick; the accelerating voltage may be between 1 to 4 KeV; the beam current may be up to about 20 microamperes; the beam diameter may be between 0.1 and 5.0 millimeters; and the distance between the mask and the workpiece (the resist-coated substrate) may be in the range of 10 to 300 microns; and the mask is a stencil mask of monocrystalline silicon free of any absorber layer and having a thickness in the range of about 0.2 to 1.0 micron. In the above described specific example, the resist is about 0.1 micron thick, the beam current is about 3 microamperes, and the beam diameter is about 1 millimeter. In the preferred embodiment the mask is a stencil mask of monocrystalline silicon free of any absorber layer and having a thickness of about 0.5 micron and is spaced a distance of about 50 microns from the substrate.

It is to be understood that the specific embodiment described is merely illustrative of the general principles of the invention and that, accordingly, other embodiments may be devised by a skilled worker in the art without departing from the spirit and scope of the invention.

What is claimed is:

1. A system for patterning a resist on a semiconductor substrate comprising:

a source of an electron beam;

a mask positioned in the path of the electron beam;

an electron-beam sensitive resist-covered substrate in the path of the electron beam and the mask;

characterized in that the resist is ultrathin, the voltage accelerating the beam is sufficiently low that the proximity effect is insignificant, the power of the beam is sufficiently low that heating of mask, electron beam sensitive resist, and substrate is also insignificant, and the density of electrons in the beam is sufficiently low that space charge effects are insignificant; and the electron beam accelerating voltage is about 2 KeV, the mask is positioned about 50 microns from the resist-coated substrate, the resist is about 0.1 micron thick, the current of the electron beam is about 3 microamperes, the beam diameter is about 1.0 millimeter, and the mask is a stencil mask of monocrystalline silicon, free of any absorber layer, and having a thickness of about 0.5 micron.

2. The system of claim 1 further comprising means for deflecting the beam as an essentially parallel beam essentially normal to the mask.

3. The system of claim 2 further comprising means for controlling the tilt of the beam at a pivot on the mask plane for the purpose of correcting distortion of the system.

4. The system of claim 3 wherein the the deflecting means is first deflecting coils and the controlling means is second deflecting coils.

5. The system of claim 1 in which the mask is free of an absorbing layer.

6. In the manufacture of silicon integrated circuits, a process of patterning a resist-covered silicon substrate comprising the steps of:

positioning in an electron beam exposure apparatus the silicon substrate having one surface on which there is a layer of an electron-beam resist to be patterned having a thickness in the range of about 0.03 to 0.3 micron;

positioning a patterned mask adjacent the resist-layered surface of the silicon substrate and spaced apart therefrom a distance of between about 10 to 300 microns; and sweeping an electron beam over the patterned mask to pass electrons through the patterned mask substantially normal to the mask at an accelerating voltage in the range of about 1 to 4 KeV and at a beam current up to about 20 microamperes, whereby the resist is patterned with insignificant heating of the mask.

7. The process of patterning a resist-covered silicon substrate of claim 6 wherein the electron beam accelerating voltage is about 2 KeV, the mask is positioned about 50 microns from the resist-coated substrate, the resist is about 0.1 micron thick, the current of the electron beam is about 3 microamperes, the beam diameter is about 1.0 millimeter, and the mask is a stencil mask of monocrystalline silicon, free of any absorber layer, and having a thickness of about 0.5 micron.

8. A system for patterning a resist on a semiconductor substrate comprising:

a source of an electron beam that has an accelerating voltage in the range of about 1 to 4 KeV, a current between about 0.3 microamperes and 20 microamperes, and a diameter of between about 0.1 and 5.0 millimeters to be relatively free of space charge effects;

a substrate covered with a electron-sensitive resist in the path of said electron beam, the resist having a thickness of between about 0.03 microns and 0.3 microns; and a mask positioned in the path of the electron beam intermediate between the source of the electron beam and the resist-covered substrate and spaced from the resist-covered substrate by between about 10 and 300 microns;

whereby the proximity effect is insignificant, the heating of the mask, resist and substrate is insignificant, and space charge effects are insignificant.

9. The system of claim 8 in which the mask forms a thin central membrane in a silicon wafer that is free of an absorber layer.

10. The system of claim 8 that further includes means for sweeping the electron beam across the surface of the mask essentially perpendicular to the mask and to the resist-covered substrate.

11. The system of claim 8 in which the electron beam exposes in the electron sensitive resist a volume that has the rough shape of a sphere whose radius is essentially one-half the thickness of the resist.

12. The system of claim 8 in which the electron beam accelerating voltage is about 2 KeV.

13. The system of claim 8 in which the mask is positioned about 50 microns from the resist-coated substrate.

14. The system of claim 8 in which the resist is about 0.1 micron thick.

15. The system of claim 8 in which the current of the beam is about 3 microamperes.

16. The system of claim 8 in which the beam diameter is about 1 millimeter.

17. The system of claim 8 in which the mask is a stencil mask of monocrystalline silicon, free of any absorber layer, and having a thickness in the range of about 0.2 to 1.0 micron.

18. The system of claim 8 in which the mask is a stencil mask of monocrystalline silicon, free of any absorber layer, and having a thickness of about 0.5 micron.

* * * * *